(12) United States Patent
Srivastava et al.

(10) Patent No.: US 6,469,322 B1
(45) Date of Patent: *Oct. 22, 2002

(54) GREEN EMITTING PHOSPHOR FOR USE IN UV LIGHT EMITTING DIODES

(75) Inventors: Alok M. Srivastava, Niskayuna, NY (US); William W. Beers, Chesterland, OH (US); Holly A. Comanzo, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/583,196

(22) Filed: May 30, 2000

Related U.S. Application Data

(63) Continuation-in-part of application No. 09/203,212, filed on Nov. 30, 1998, now Pat. No. 6,252,254, which is a continuation-in-part of application No. 09/019,647, filed on Feb. 6, 1998, now abandoned.

(51) Int. Cl.⁷ .............................. H01L 33/00; H01J 1/62
(52) U.S. Cl. .......................... 257/89; 257/98; 257/100; 313/501; 313/502; 313/503
(58) Field of Search .............................. 257/88, 89, 98, 257/99, 100, 103; 313/501, 502, 503, 512

(56) References Cited

U.S. PATENT DOCUMENTS

| | | | |
|---|---|---|---|
| 5,813,752 A | 9/1998 | Singer et al. | 313/506 |
| 5,813,753 A | 9/1998 | Vriens et al. | 313/506 |
| 5,815,228 A | 9/1998 | Flynn | 349/71 |
| 5,834,053 A | 11/1998 | Dye et al. | 427/66 |
| 5,847,507 A | 12/1998 | Butterworth et al. | 313/512 |
| 5,895,932 A | 4/1999 | Bojarczuk, Jr. et al. | 257/103 |
| 5,898,185 A | 4/1999 | Bojarczuk, Jr. et al. | 257/103 |
| 5,959,316 A | 9/1999 | Lowery | 257/100 |
| 6,252,254 B1 * | 6/2001 | Soules et al. | 257/89 |

FOREIGN PATENT DOCUMENTS

EP  0 936 682 A1  8/1999

* cited by examiner

Primary Examiner—Minh Loan Tran
(74) Attorney, Agent, or Firm—Fay, Sharpe, Fagan, Minnich & McKee LLP

(57) ABSTRACT

A green-emitting phosphor is provided, which has the general formula $Ln_xBO_3: Ce^{3+}_y, Tb^{3+}_z$, where Ln includes one or more lanthanide-type elements, such as Sc, Y, La, Gd, and Lu. $x+y+z=1$; $0 \leq x \leq 0.98$; $0 \leq y \leq 0.5$; and $0 \leq z \leq 0.5$. The phosphor efficiently converts light in the UV/blue region of the spectrum (250–400 nm) to light of longer wavelength, with a peak emission intensity of about 545 nm. The phosphor is used alone, or in a phosphor blend for converting UV/blue light from a GaN-base light emitting diode to green or white light, respectively.

19 Claims, 2 Drawing Sheets

GREEN EMITTING PHOSPHOR FOR USE IN UV LIGHT EMITTING DIODES

This application is a Continuation-in-Part of U.S. application Ser. No. 09/203,212, filed Nov. 30, 1998, now U.S. Pat. No. 6,252,254, which was a Continuation-in-Part of U.S. application Ser. No. 09/019,647, filed Feb. 6, 1998, abandoned.

BACKGROUND OF THE INVENTION

This invention relates to light emitting devices comprising a UV/blue light emitting diode (LED) and a UV/blue excitable, green light emitting phosphor. It finds particular application in combination with a blend of phosphors, which emit in the blue, green, and red wavelengths, for converting LED-generated ultraviolet (UV) radiation into white light for general illumination purposes. It should be appreciated, however, that the invention is also applicable to the conversion of radiation from UV/blue lasers and other UV sources to green light.

The advent of GaN-based epitaxial structures has lead to the development of UV and or blue (UV/blue) light emitting devices, including light emitting diodes (LEDs) and lasers. By combination of the light emitting device with a phosphor, generation of visible light (e.g., red, blue, or white light) is achieved. The phosphor transforms the UV or blue radiation into light of longer wavelength, for example, by employing a blue absorbing, yellow emitting phosphor, such as $Y_3Al_5O_{12}$—$Ce^{3+}$ (commonly referred to as YAG-Ce), obtainable from Nichia Chemical Company.

The YAG-Ce phosphor converts LED blue radiation into yellow light. This produces a white field with a color rendering index (CRI) of about 77 and a color temperature ranging from about 6000 K to 8000 K. For some applications, conversion of UV/blue light from an LED to visible light using phosphors may be more attractive than the direct application of visible LEDs. Such UV/blue LED phosphor devices, for example, offer the opportunity to encompass a wider color range, which is important for display as well as for illumination applications.

Recently, UV LEDs have been developed which efficiently convert the applied electrical energy into an ultraviolet emission at about 371 nm. There remains a need for a phosphor which converts this radiation to visible light in the green portion of the spectrum.

The present invention provides a new and improved phosphor and method of formation, which overcomes the above-referenced problems and others.

SUMMARY OF THE INVENTION

In an exemplary embodiment of the present invention a light source is provided. The light source includes a light emitting component which emits light at a first wavelength and a phosphor material positioned to receive the light emitted by the light emitting component The phosphor material includes a green-emitting phosphor which converts a portion of the light of the first wavelength to light of a second, longer wavelength, the green-emitting phosphor having the general formula $LnBO_3$: $Ce^{3+}$, $Tb^{3+}$ where:

Ln includes one ore more of Sc, Y, La, Gd, Lu, and other lanthanide elements. The phosphor preferably has the formula $Ln_xBO_3$: $Ce^{3+}_y$, $Tb^{3+}_z$ where:

x=1–(y+z);

0≦x≦0.98;

0.01≦y≦0.5; and 0.01≦z≦0.5.

In another exemplary embodiment of the present invention a method of converting UV/blue light to light in the green region of the electromagnetic spectrum is provided. The method includes converting the UV/blue light with a phosphor of the general formula $Ln_xBO_3$: $Ce^{3+}_y$, $Tb^{3+}_z$, as described above.

In another exemplary embodiment of the present invention a phosphor material having the general formula $Ln_xBO_3$: $Ce^{3+}_y$, $Tb^{3+}_z$ is provided.

One advantage of the present invention is the provision of a green-emitting phosphor having good color rendering which converts UV radiation to green light with a high efficiency.

Another advantage of the present invention is a phosphor blend comprising a green-emitting phosphor for converting radiation from a UV/blue light emitting diode to visible light.

Still further advantages of the present invention will become apparent to those of ordinary skill in the art upon reading and understanding the following detailed description of the preferred embodiments

DESCRIPTION OF THE PREFERRED EMBODIMENTS

A green-emitting phosphor having the general formula $LnBO_3$: $Ce^{3+}$, $Tb^{3+}$, which can be expressed stoichiometrically by the formula $Ln_xBO_3$: $Ce^{3+}_y$, $Tb^{3+}_z$ where:

Ln includes one ore more of Sc, Y, La, Gd, Lu x=1–(y+z)

0≦x≦0.98

0.01≦y≦0.5

0.01≦z≦0.5

Preferred Ln elements are Y, Gd, Sc, and La. The green-emitting phosphor can be an yttrium-based phosphor, $Y_xBO_3$:$Ce^{3+}_y$, $Tb^{3+}_z$, in which the other Ln elements are absent, a mixture of yttrium and one or more of gadolinium, lanthanum, scandium, and lutetium, or an yttrium-free composition containing one or more of the remaining Ln elements. In one preferred embodiment, the green-emitting phosphor comprises 50 parts Y, 50 parts Gd, 20 parts Ce and 10 parts Tb (i.e. approximately $(Y_{0.39}Gd_{0.39})BO_3$: $Ce^{3+}_{0.15}$, $Tb^{3+}_{0.07}$). In general, it for the ratio of Ce:Tb to be about 2:1 and for n to be at least about 0.2. Other lanthanum elements may also be used as Ln elements in the green phosphor, particularly those that contribute to the green-emitting properties of the phosphor. While small amounts of other, non-lanthanide-type elements (i.e., other than Y, Sc, and lanthanide series elements) may be present in the green-emitting phosphor, these are preferably kept at low levels to maintain the efficiency of the phosphor.

In the description of phosphors, a conventional notation is used, wherein the chemical formula for a host or matrix compound is given first, followed by a colon and the formula for an activator (an impurity that activates the host crystal to luminesce). For example, in the case of a green emitter, $(Y_aGd_bLa_cSc_d)BO_3:Ce^{3+}, Tb^{3+}, (Y_aGd_bLa_cSc_d)BO_3$ is the host and $Ce^{3+}$ and $Tb^{3+}$ are the activators.

Figure 1:
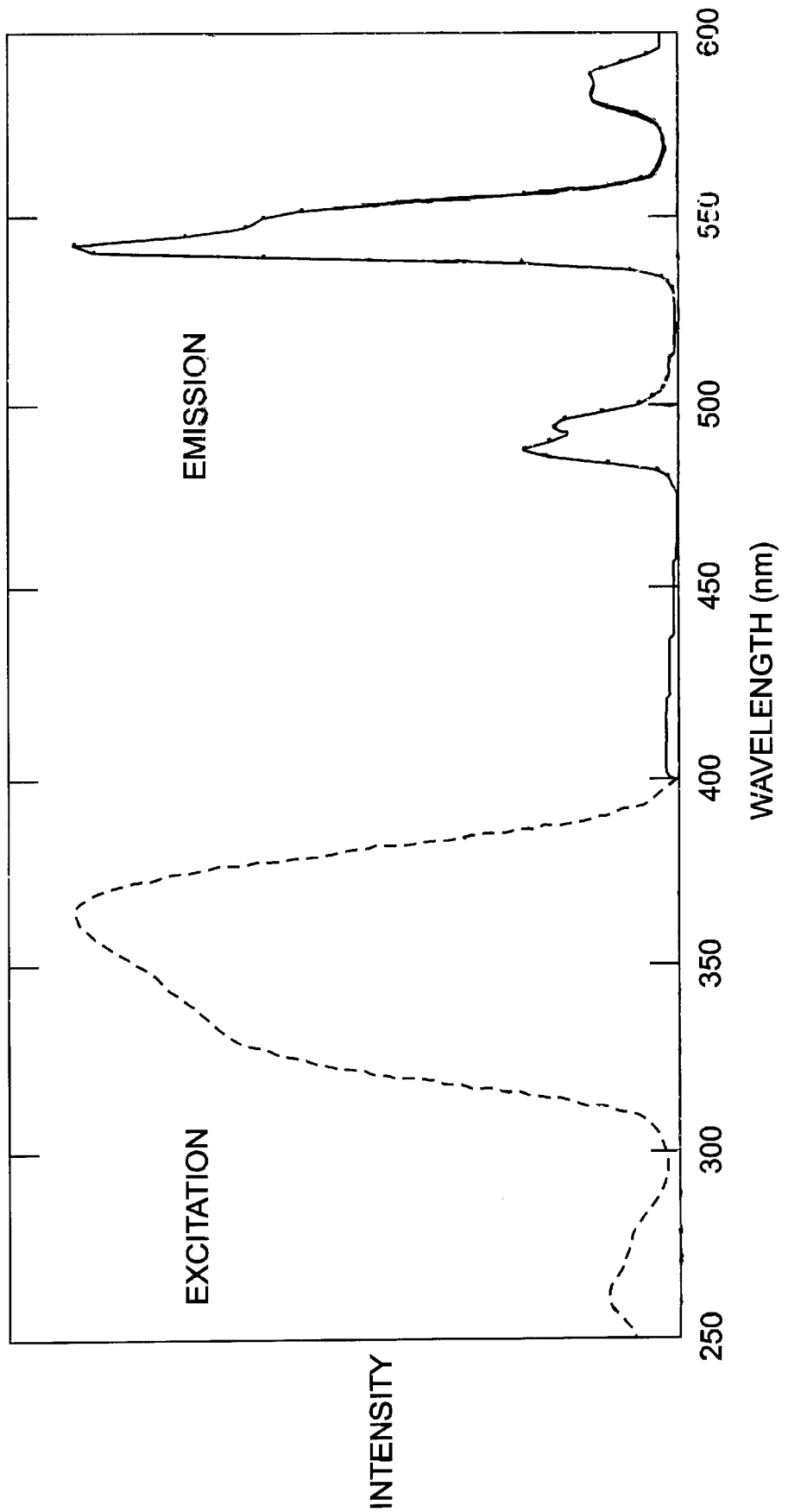
FIG. 1 is a plot of intensity vs wavelength showing the emission and excitation spectra of a green-emitting phosphor according to the present invention.

FIG. 1 shows an emission and excitation spectrum of the green-emitting phosphor. As can be seen, the excitation spectrum peaks between about 320 and 380 nm, with a maximum excitation at around 370 nm. The phosphor has three emission peaks, the larger, central peak ranging from about 530–570 nm, with a sharp maximum at about 545 nm, indicating a very pure emission for good color rendering. Depending on the combination of Ln elements used in the green-emitting phosphor, the peaks may shift slightly. For example, the excitation peak may shift from 370 to 375 nm.

As shown in FIG. 1, the green-emitting phosphor converts radiation in the blue/UV portion of the spectrum to green light and thus has application in the conversion of radiation from UV/blue laser and light emitting diodes (referred to collectively herein as "LEDs"). The efficiency of conversion by the green-emitting phosphor is good, i.e., a large proportion of the UV light emitted by the LED is converted to useful, visible light.

The green-emitting phosphor can be formed, for example, by reacting oxides of the chosen Ln elements and oxides of Tb and Ce with boric acid. Preferably, the starting materials, $Ln_2O_3$, $Tb_4O_7$, $CeO_2$, and $H_3BO_3$ (an excess of 1–50% $H_3BO_3$ over the stoichiometric proportion is preferably used) are intimately blended. The mixture is then heated in a covered crucible at about 1000° C. for about six hours in a slightly reducing atmosphere. The slightly reducing atmosphere preferably comprises about 1% hydrogen in a carrier gas, such as nitrogen (i.e. 1% $H_2$:99% $N_2$). At higher concentrations of hydrogen, luminescence of the resulting green-emitting phosphor tends to be reduced, or eliminated altogether. Lower concentrations of hydrogen may be used in the reducing atmosphere, but the heating time may be need to be extended accordingly. The resulting green-emitting phosphor luminesces bright green under 370 nm UV radiation.

Figure 2:
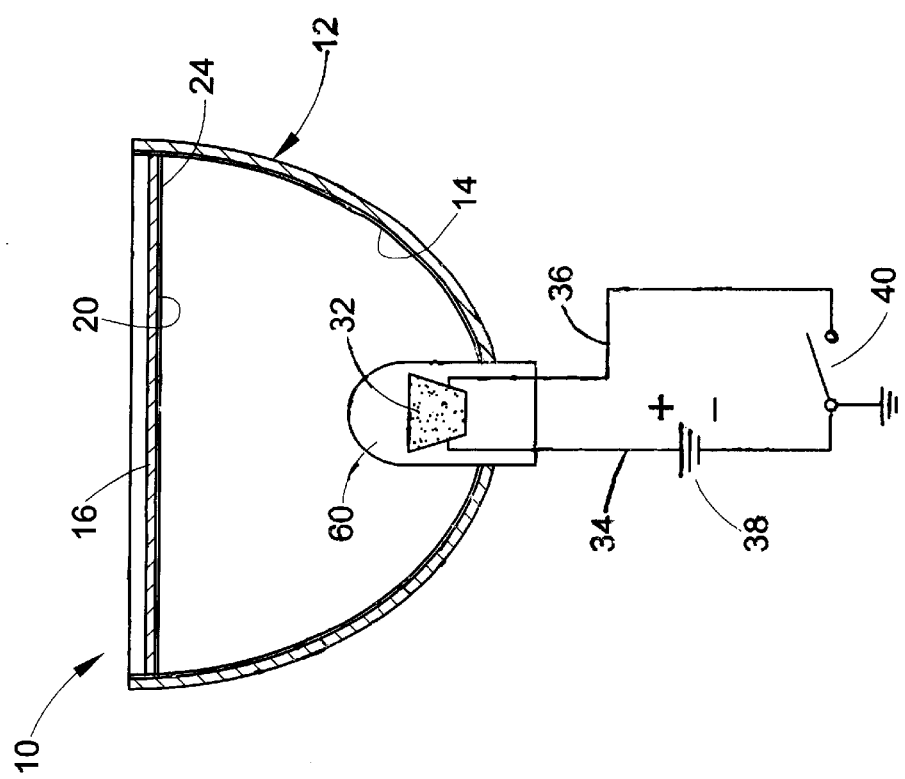
FIG. 2 is a schematic diagram of a lamp employing the green-emitting phosphor of the present invention.

With reference to FIG. 2, a schematic view of a light source, such as a lamp 10 includes a cup-shaped reflector housing 12, which is coated on its interior surface with a reflective coating 14 capable of reflecting light in the UV and visible range of the electromagnetic spectrum. The reflector housing may have a variety of configurations for reflecting light as a beam, or for providing more diffuse light. A light transmissive window 16 covers an open end of the housing. The window may be a lens, for focussing light emitted from the housing, or a sheet of light transmissive material, such as glass, plastic, or the like.

One surface of the window, preferably the interior surface 20, is coated with a coating 24 of a phosphor material, which includes the green-emitting phosphor of the present invention. The phosphor material may include two or more different phosphors (fluorescent materials), at least one of which is the green-emitting phosphor. When the phosphor coating 24 includes two or more different phosphors, these are preferably mixed together in the coating. Alternatively, the different phosphors are layered in the coating. Optionally, the lens or other portion of the device includes a UV filter which reflects unconverted UV light back into the reflector housing.

A light-emitting component 32, such as a light emitting diode or laser diode (LED), or a bank of LEDs, is positioned at the base of the housing 12. Electrical leads 34, 36 connect the light-emitting component 32 to a source of power 38, such as a battery, or other electrical power source. On application of a voltage (e.g., by operating a switch 40), radiation is emitted by the LED 32 into the housing and may be reflected from the reflective coating 14. The radiation impinges on the phosphor material 24, which converts all or a portion of the emitted radiation from the LED 32 to longer wavelengths, in the visible region of the spectrum.

The phosphors that comprise the coating 24 are substances which are capable of absorbing a part of the light emitted by the LED 32 and emitting light of a wavelength different from that of the absorbed light. The green-emitting phosphor in the phosphor material 24 converts radiation in the UV/blue region of the spectrum to light in the green region of the visible spectrum. The green-emitting phosphor may be complemented by red-emitting and/or blue emitting phosphors in the phosphor material 24 to produce a mixture of light of different wavelengths, which are combined to form light of a selected color, such as white light. The color of the light is dependent on the selected mixture of phosphors in the phosphor mixture and on the emission spectrum of the LED 32.

The visible light passes through the window 16 and/or is focussed by the lens.

Light emitting components 32 suited to use in the present invention include GaN-based (InAlGaN) semiconductor devices. Suitable GaN semiconductor materials for forming the light emitting components are generally represented by the general formula $In_iGa_jAl_kN$, where $0 \leq i$, $0 \leq j$, $0 \leq k$, and $i+j+k=1$. The nitride semiconductor materials may thus include materials such as InGaN and GaN, and may be doped with various impurities, for example, for improving the intensity or adjusting the color of the light emitted. Laser diodes are similarly formed from an arrangement of GaN layers. Techniques for forming LEDs and LDs are well known in the art.

GaN-based light emitting devices are capable of emitting light with high luminance. At least a portion of the emission spectrum is in the region of the electromagnetic spectrum corresponding to the green phosphor's excitation spectrum. A suitable GaN-based LED device includes a substrate layer formed from a single crystal of, for example, sapphire, silicon carbide, or zinc oxide. A epitaxial buffer layer, of, for example, $n^+$ GaN is located on the substrate, followed by a sequence of epitaxial layers comprising cladding layers and active layers. Electrical contact is made between two of the layers and corresponding voltage electrodes (through a metal contact layer) to connect the LED to the circuit and source of power.

The wavelength of the radiation emitted by an LED is dependent on the configuration of the semiconductor layers employed in forming the LED. As is known in the art, the composition of the semiconductor layers and the dopants employed can be selected so as to produce an LED with an emission spectrum which closely matches the excitation (absorption) spectrum of the phosphor material 24.

The LED 32 is preferably protected by a resin mold 60, which may be formed from a clear epoxy, or other transparent material, which transmits the light emitted from the light emitting components. Preferred epoxy encapsulation materials include UV blue light resistant epoxies, such as cycloaliphatic epoxies.

In an alternative embodiment, the phosphor material is mixed homogeneously with the encapsulation material to form the resin mold 60. When the power supply is connected with the light emitting source 32, the UV/blue light emitted by the source 32 passes into the encapsulation material where it strikes the phosphor material and is converted to visible light.

Figure 3:
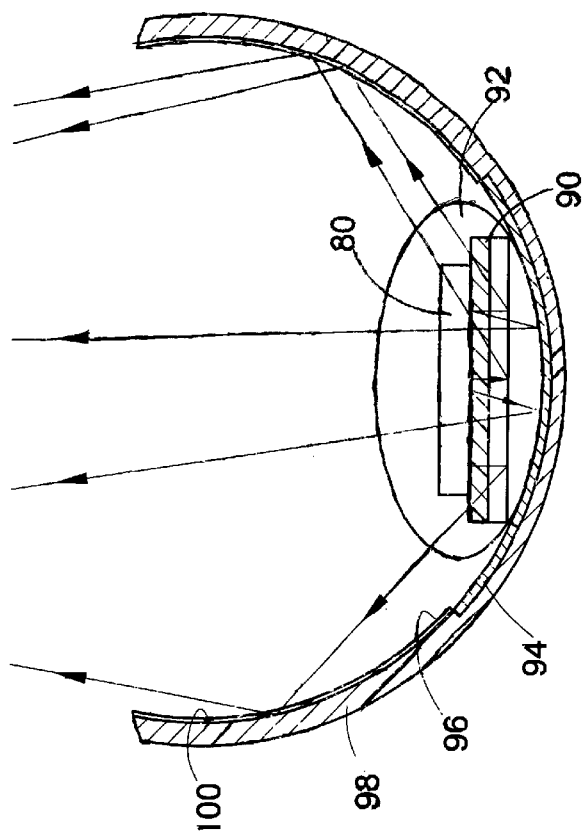
FIG. 3 is a schematic view of an alternative embodiment of a lamp according to the present invention.

In another embodiment, the radiation from the LED may be transmitted from an LED 80 through the LED substrate 90 onto a phosphor coated screen 94 as shown in FIG. 3. FIG. 3 shows the screen 94 formed on a portion of the interior surface 96 of a housing 98, although other locations for the screen are also contemplated. The light emitted by the phosphor screen is then reflected by a reflective surface 100 on the interior surface of the housing or another suitable reflective surface.

Other arrangements are also contemplated. For example, the phosphors may be arranged in different regions of the lamp and the light emitted from each region combined to form the resulting output.

A variety of phosphors may be used in the present invention to form a phosphor blend. Examples of phosphors which may be utilized include blue emitters, such as $BaMg_2Al_{16}O_{27}$: $Eu^{2+}$, or $(Ba, Sr, Ca)_5(PO_4)_3Cl$: $Eu^{2+}$ which convert a portion of the UV light to blue light; and red emitters, such as $Y_2O_3$ $Bi^{3+}$, $Eu^{2+}$, which convert a portion of the UV light to red light. A preferred triphosphor blend includes 40% of the green emitter, 50% of the red emitter, and 10% of the blue emitter.

Other phosphors which may be utilized in a phosphor blend, in a wide range of combinations, include cerium activated phosphors of garnet-based fluorophors containing at least one element selected from the group consisting of Y, Lu, Sc, La, Gd, and Sm and at least one element selected from Al, Ga, and In. Examples of this type of phosphor include $Y_3Al_5O_{12}$:Ce. Such phosphors are disclosed in EP Patent Application EP 0 936 682 A1 to Nichia Chemical Industries, Ltd. Other suitable phosphors include $Y_2O_2S$:Eu (a red emitter); and ZnS:Cu, Ag (a green emitter).

U.S. Ser. No. 09/203,212 discloses the use and preparation of a variety of phosphor materials, including $YBO_3$: $Ce^{3+}Tb^{3+}$ and is incorporated herein by reference, in its entirety. It should be noted that the descriptions of the preparation red emitting phosphors $Y_2O_2S$: $Eu^{3+}$, $Bi^{3+}$ and $Yvo_4$:$Eu^{3+}$, $Bi^{3+}$, have been reversed in the text of that application as will be readily apparent to one skilled in the art.

In another embodiment, light from the green-emitting phosphor is used to excite one or more additional phosphors.

The phosphors may be mixed together in a single layer, or separately layered to form a multi-layer coating on the window 16. The phosphors may be blended by combining them in a dispersant, such as water. The resulting suspension is applied to a substrate, such as the window of FIG. 2, and dried. Or, the phosphor material may be combined in powdered or granular form with the encapsulation material. The product of phosphor grain density and grain size should be high enough to ensure that most of the UV/blue light is converted to visible light.

Phosphors to be used in a phosphor blend in light source 10 preferably have the following attributes:

1. Light resistance. Ideally, the phosphor is one which has a good resistance to light so that its fluorescent properties are not degraded when used over an extended period of time.

2. Capability of emitting light with a high efficiency.

3. Temperature resistance, if located in the vicinity of the LED.

4. Weatherability in the operating environment of the light source.

While the light source has been described in terms of a reflector housing, other arrangements which do not rely on a reflective surface are also contemplated. In one alternative embodiment, light emitted by the LED is transported by light pipes to the phosphor coating.

The invention has been described with reference to the preferred embodiment. Obviously, modifications and alterations will occur to others upon reading and understanding the preceding, detailed description. It is intended that the invention be construed as including all such modifications and alterations insofar as they come within the scope of the appended claims or the equivalents thereof.

What is claimed is:

1. A light source comprising:
   a light emitting component which emits light at a first wavelength; and
   a phosphor material positioned to receive the light emitted by the light emitting component, the phosphor material including a green-emitting phosphor which converts a portion of the light of the first wavelength to light of a second, longer wavelength, the green-emitting phosphor having the general formula $Ln_xBO_3$: $Ce^{3+}_y$, $Tb^{3+}_z$, where:
   $x=1-(y+z)$;
   $0<x\leq0.98$;
   $0.01\leq y\leq0.5$;
   $0.02\leq z\leq0.5$; and
   Ln includes one or more of Sc, Y, La, Gd, Lu, and other lanthanide elements.

2. The light source of claim 1, wherein the light emitting component is selected from the group consisting of light emitting diodes and laser diodes.

3. The light source of claim 2, wherein the light emitting component emits light in at least one of the blue and the UV regions of the electromagnetic spectrum.

4. The light source of claim 3, wherein the light emitting component includes a GaN-based semiconductor material.

5. The light source of claim 1, wherein Ln is selected from the group consisting of Y, Sc, La, and Gd, and combinations thereof.

6. The light source of claim 1, wherein Ln consists of Y and Gd in approximately equal proportions.

7. The light source of claim 1, wherein the ratio of Ce:Tb is about 2:1.

8. The fight source of claim 7, wherein the phosphor material further includes at least one of a blue-emitting phosphor and a red-emitting phosphor.

9. The light source of claim 8, wherein the blue emitting phosphor is selected from the group consisting of:
   $(Ba, Sr, Ca)_5(PO_4)_3Cl$:$Eu^{2+}$; $Mn^{2+}$; $Y_2O_3$:$Bi^{3+}$, $Eu^{2+}$; and mixtures thereof.

10. The light source of claim 8, wherein the red emitting phosphor is selected from the group consisting of:
    $Ca_8Mg(SiO_4)_4Cl_2$:$Eu^{2+}$, $Mn^{2+}$; $Y_2O_3$: $Bi^{3+}$,$Eu^{2+}$; $Y_2O_2S$:Eu; and mixtures thereof.

11. The light source of claim 1, further including:
    a housing; and
    a reflective coating disposed on an interior surface of the housing, the light emitting component being positioned within the housing.

12. The light source of claim 11, wherein the phosphor material is dispersed in a medium which encapsulates the light emitting component.

13. The light source of claim 1, wherein said second wavelength light is used to excite a second phosphor material.

14. A light source comprising:
    a housing, the housing being closed by a window;
    a light emitting component positioned within the housing which emits light at a first wavelength; and
    a phosphor material, the phosphor material being deposited on the window and positioned to receive the light emitted by the light emitting component, the phosphor material including a green-emitting phosphor which converts a portion of the light of the first wavelength to light of a second, longer wavelength, the green-emitting phosphor having the general formula $Ln_xBO_3: Ce^{3+}_y, Tb^{3+}_z$, where:

$x=1-(y+z)$;
$0<x\leq0.98$;
$0.01\leq y\leq0.5$;
$0.02\leq z\leq0.5$; and
Ln includes one or more of Sc, Y, La, Gd, Lu, and other lanthanide elements.

15. A method of converting UV/blue light to light in the green region of the electromagnetic spectrum comprising:
converting the UV/blue light with a phosphor of the general formula $Ln_xBO_3: Ce^{3+}_Y, Tb^{3+}_z$ where:
Ln includes one or more of Sc, Y, La, Gd, Lu, and other lanthanide elements;
$x=1-(y+z)$;
$0<x\leq0.98$;
$0.01\leq y\leq0.5$; and
$0.01\leq z\leq0.5$.

16. The method of claim 15, wherein Ln is selected from the group consisting of Y, Sc, La, and Gd, and combinations thereof.

17. The method of claim 15, wherein Ln consists of Y and Gd in approximately equal proportions.

18. The method of claim 15, wherein the ratio of Ce:Tb is about 2:1.

19. A phosphor material having the general formula $Ln_xBO_3: Ce^{3+}_y, Tb^{3+}_z$ where:
Ln includes one or more of Sc, Y, La, Gd, Lu, and other lanthanide elements;
$x=1-(y+z)$;
$0<x\leq0.98$;
$0.01\leq y\leq0.5$; and
$0.01\leq z\leq0.5$.

* * * * *